(12) United States Patent
Chen et al.

(10) Patent No.: US 8,365,046 B2
(45) Date of Patent: Jan. 29, 2013

(54) METHOD AND APPARATUS FOR NON-UNIFORM REDUNDANCY PACKET ERROR CORRECTION

(75) Inventors: Ximing Chen, Ringoes, NJ (US); Chengzhou Li, Bridgewater, NJ (US); Herbert B. Cohen, Allentown, PA (US)

(73) Assignee: LSI Corporation, Milpitas, CA (US)

( * ) Notice: Subject to any disclaimer, the term of this patent is extended or adjusted under 35 U.S.C. 154(b) by 305 days.

(21) Appl. No.: 12/953,405

(22) Filed: Nov. 23, 2010

(65) Prior Publication Data

US 2012/0131420 A1 May 24, 2012

(51) Int. Cl.
*H03M 13/00* (2006.01)
*G06F 11/00* (2006.01)

(52) U.S. Cl. ........ 714/776; 714/752; 714/799; 714/821; 370/216; 370/241; 370/242

(58) Field of Classification Search .................. 714/752, 714/776, 799, 821; 370/216, 241, 242
See application file for complete search history.

(56) References Cited

U.S. PATENT DOCUMENTS

| 6,438,105 | B1* | 8/2002 | Qarni et al. | 370/231 |
| 7,636,298 | B2 | 12/2009 | Miura et al. | |
| 7,707,478 | B2 | 4/2010 | Jiang | |
| 2012/0192031 | A1* | 7/2012 | Liu et al. | 714/752 |

* cited by examiner

*Primary Examiner* — John J Tabone, Jr.
(74) *Attorney, Agent, or Firm* — Otterstedt, Ellenbogen & Kammer, LLP

(57) ABSTRACT

A method for correcting at least one error in a data transmission over a packet-based communication network includes the steps of: generating a sequence of data packets for transmission over the packet-based communication network, the sequence of data packets being arranged into a plurality of packet frames, each of at least a subset of the packet frames including at least a primary data packet and a number of redundant data packets which is a function of a prescribed redundancy pattern, the subset of packet frames having a non-uniform distribution of redundant data packets therein; transmitting the sequence of data packets over the communication network; and recovering at least one missing data packet in the sequence of data packets using at least one corresponding redundant data packet in at least one subsequently received packet frame when the missing data packet is identified in a receiver of the sequence of data packets.

27 Claims, 3 Drawing Sheets

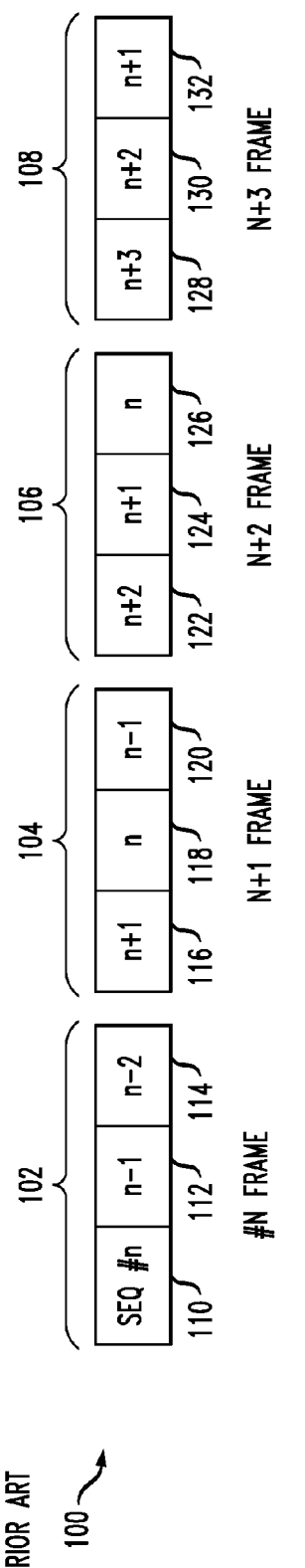
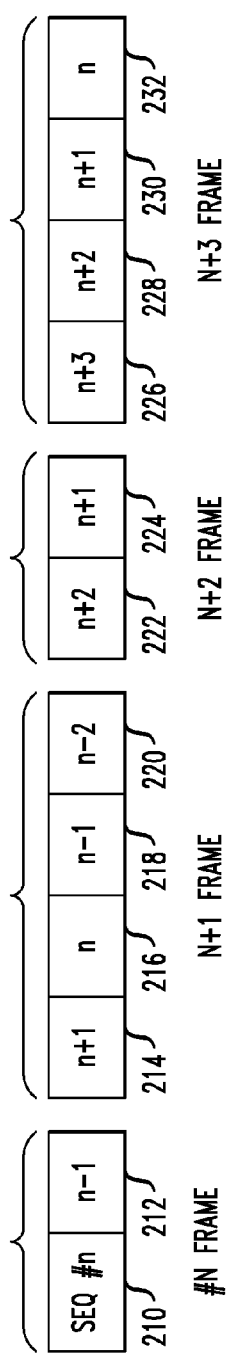
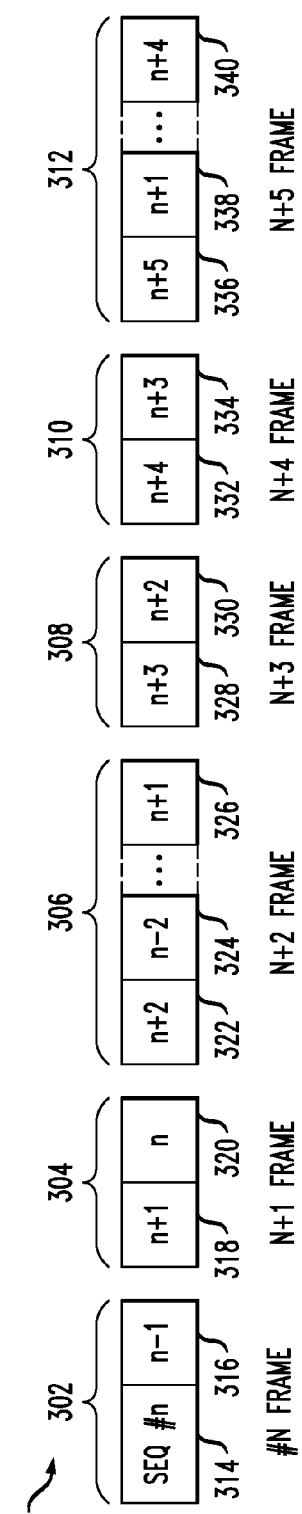
FIG. 1 PRIOR ART
FIG. 2
FIG. 3

500

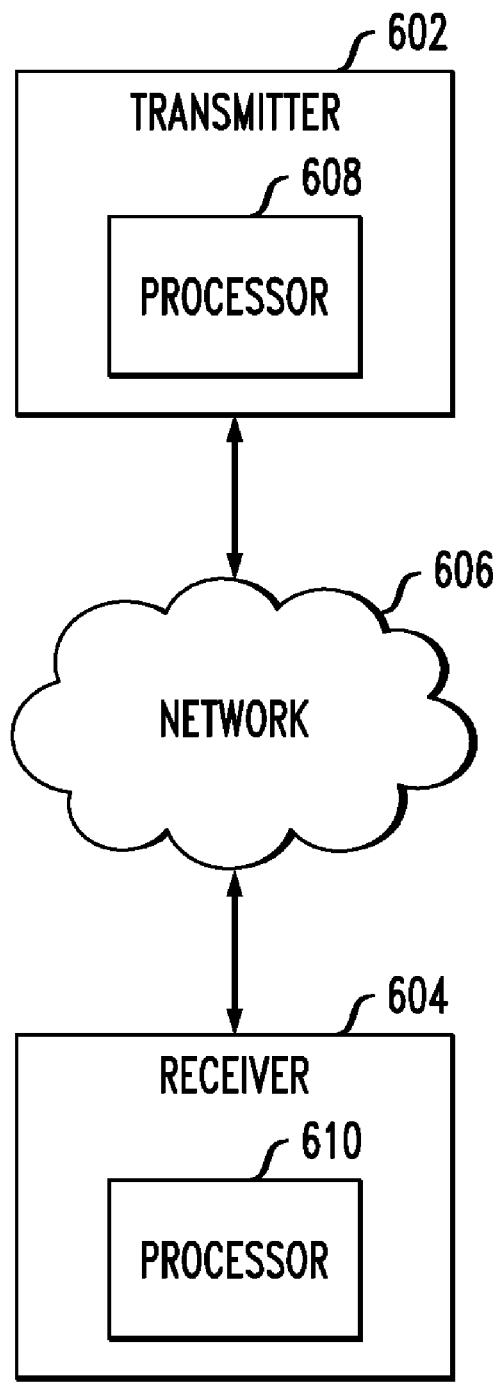

METHOD AND APPARATUS FOR NON-UNIFORM REDUNDANCY PACKET ERROR CORRECTION

FIELD OF THE INVENTION

The present invention relates generally to the electrical, electronic, and computer arts, and more particularly relates to error correction in a data communication network.

BACKGROUND OF THE INVENTION

Data is typically conveyed in a communication network, such as a wireless network, in the form of packets. The packets of data communicated in the network are often vulnerable to corruption by various mechanisms including, for example, noise (e.g., channel noise), competing signals interfering with the communication, channel interference (e.g., intersymbol interference (ISI)), channel fading, etc. As a result, data arriving at a receiver may differ from the corresponding data communicated by a transmitter.

In order to facilitate the detection and correction of certain errors which may occur in a data transmission, various types of redundant information, often referred to as error correction codes, can be included as part of the transmitted data. Generally, these error correction codes are inserted into the data message itself (i.e., encoded) to enable reliable delivery of the data over an otherwise unreliable communication channel. Errors may also be corrected by a variety of communication techniques including those that allow a receiver to request retransmission of a packet whenever a missing packet or an error in a given packet is detected, or techniques involving the transmission of redundant packets which then enable the receiver to derive the correct data from the multiple packets.

Unfortunately, however, these known techniques for correcting errors in received data in a packet-based communication network require significant additional overhead to store and convey the required redundant information. The transmission of redundant information, even unnecessarily (e.g., when the data is not received in error), substantially increases a bandwidth requirement of the transmission, and is therefore undesirable. Moreover, even with the high cost of bandwidth, traditional error correction techniques are typically not adequate in handling bursting packet losses, which are common in a packet-based network (e.g., an Internet Protocol (IP) network). Thus, several problems remain in the reliable transmission of data in real-time over a packet-based communication network.

SUMMARY OF THE INVENTION

Aspects of the present invention provide an innovative error correction scheme for efficiently facilitating data transmissions over a packet-based communication network. Techniques of the invention, in illustrative embodiments thereof, offer an alternative error correction methodology for data transmissions over a packet-based communication network which advantageously addresses at least the above-noted problems associated with conventional error correction methodologies without significantly increasing bandwidth requirements or system overhead and/or complexity. Accordingly, techniques of the present invention offer an alternative error correction methodology which is superior to conventional error correction approaches.

In accordance with one embodiment of the invention, a method for correcting at least one error in a data transmission over a packet-based communication network includes the steps of: generating a sequence of data packets for transmission over the packet-based communication network, the sequence of data packets being arranged into a plurality of packet frames, each of at least a subset of the packet frames including at least one primary data packet and a number of redundant data packets which is a function of a prescribed redundancy pattern, the subset of packet frames having a non-uniform distribution of redundant data packets therein across the plurality of packet frames; transmitting the sequence of data packets over the communication network; and recovering at least one missing data packet in the sequence of data packets using at least one corresponding redundant data packet in at least one subsequently received packet frame when the missing data packet is identified in a receiver of the sequence of data packets.

In accordance with another embodiment of the invention, an apparatus for performing error correction in a data transmission over a packet-based communication network includes at least one processor operative to generate a sequence of data packets for transmission over the packet-based communication network, the sequence of data packets being arranged into a plurality of packet frames. Each of at least a subset of the packet frames includes at least one primary data packet and a number of redundant data packets which is a function of a prescribed redundancy pattern. The subset of packet frames has a non-uniform distribution of redundant data packets therein across the plurality of packet frames. The processor is further operative to forward the sequence of data packets to a transmitter for transmission of the sequence of data packets over the communication network. At least one missing data packet in the sequence of data packets is recoverable using at least one corresponding redundant data packet in at least one subsequently received packet frame when the missing data packet is identified in a receiver of the sequence of data packets.

In accordance with yet another embodiment of the invention, an electronic system for performing error correction in a data transmission over a packet-based communication network includes a transmitter and a receiver adapted to communicate with one another via the communication network. The transmitter includes at least one processor operative to generate a sequence of data packets for transmission over the communication network, the sequence of data packets being arranged into a plurality of packet frames. Each packet frame includes at least a primary data packet and a number of redundant data packets which is a function of a prescribed redundancy pattern. The packet frames have a non-uniform distribution of redundant data packets therein. The transmitter is operative to transmit the sequence of data packets over the communication network. The receiver is operative to receive the sequence of data packets from the communication network. The receiver includes at least one processor operative: (i) to identify at least one missing data packet in the received sequence of data packets; and (ii) to recover the at least one missing data packet using at least one corresponding redundant data packet in at least one subsequently received packet frame when the missing data packet is identified.

In accordance with still another embodiment of the invention, a transceiver adapted for performing error correction in a packet-based communication network is provided. The transceiver includes at least one transmitter for connection to the communication network and at least one receiver adapted for connection to the communication network. The transmitter is operative to transmit a sequence of data packets for transmission over the packet-based communication network, the transmitted sequence of data packets being arranged into a plurality of packet frames. Each of at least a subset of the packet frames includes at least a primary data packet and a number of redundant data packets which is a function of a prescribed redundancy pattern. The subset of packet frames has a non-uniform distribution of redundant data packets therein across the plurality of packet frames. The transmitter is operative to transmit the sequence of data packets over the communication network. The receiver is operative: to receive a sequence of data packets from the packet-based communication network; to identify at least one missing data packet in the received sequence of data packets; and to recover the missing data packet(s) using at least one corresponding redundant data packet in one or more subsequently received packet frames when the missing data packet(s) is/are identified.

These and other features, objects and advantages of the present invention will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals indicate corresponding elements throughout the several views, and wherein:

FIG. 1 illustrates at least a portion of an exemplary sequence of packets in a standard uniform redundancy error correction methodology;

FIG. 2 is a conceptual illustration which depicts at least a portion of an exemplary sequence of packets in a non-uniform redundancy error correction methodology, according to an embodiment of the present invention;

FIG. 3 is a conceptual illustration which depicts at least a portion of an exemplary sequence of packets in a non-uniform redundancy error correction methodology, according to another embodiment of the present invention;

FIG. 6 is a block diagram illustrating an electronic system for performing error correction in a data transmission over a packet-based communication network, according to an embodiment of the present invention.

Figure 4:
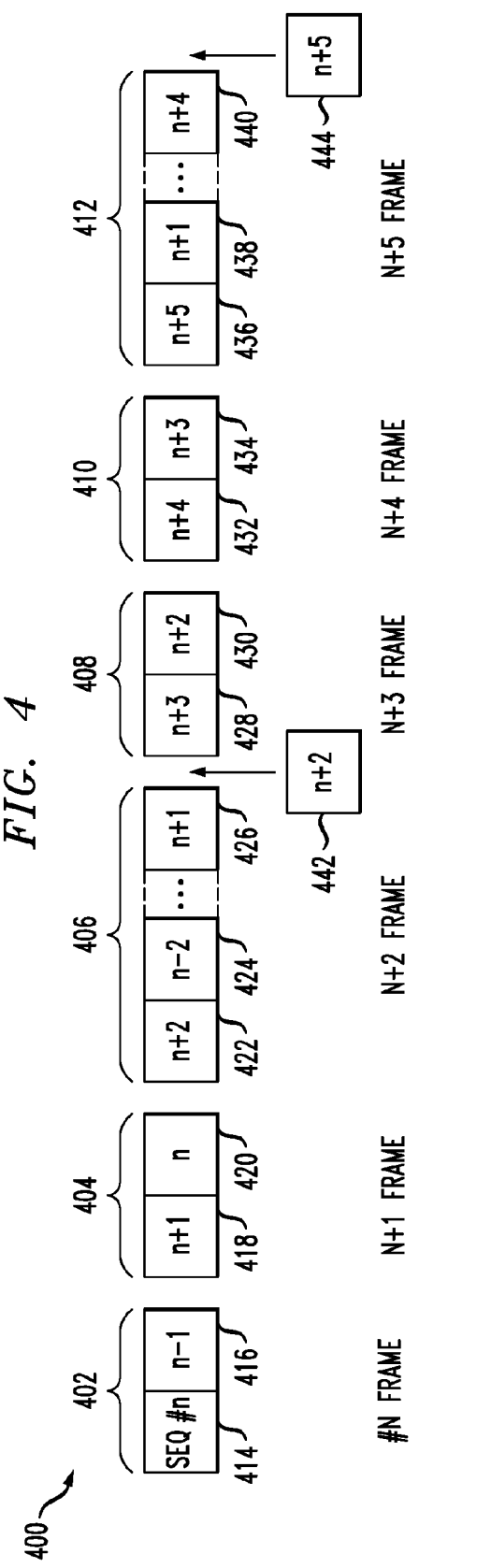
FIG. 4 is a conceptual illustration which depicts at least a portion of an exemplary sequence of packets in a non-uniform redundancy error correction methodology, according to yet another embodiment of the present invention.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION OF PREFERRED EMBODIMENTS

Principles of the present invention will be described herein in the context of illustrative embodiments of a non-uniform redundancy error correction methodology and apparatus for correcting packet errors in a packet-based communication network. It is to be appreciated, however, that the invention is not limited to the specific apparatus and methods illustratively shown and described herein. Rather, aspects of the invention are directed broadly to techniques for efficiently correcting errors which may occur in a data transmission over a packet-based communication network. In various embodiments, the innovative error correction scheme can be implemented, for example, in a client computing device, a residential gateway, a network device and the like, to provide reliable delivery of data via communication channels, either connectionless or connection oriented, using a standard communication protocol which may include, without limitation, Voice over Internet Protocol (VoIP), Facsimile over Internet Protocol (FoIP), Ethernet, Asynchronous Transfer Mode (ATM), Multiprotocol Label Switching (MPLS), International Telecommunication Union (ITU) X.25, user datagram protocol (UDP), transmission control protocol (TCP), frame relay, etc., in a packet-based communication network (e.g., an IP network, wide area network (WAN), local area network (LAN), wireless LAN (WLAN), packet-switching exchange (PSE), etc.) without significantly increasing bandwidth requirements or system overhead and/or complexity. Examples of communication channels are well known in the art and may include, without limitation, wireless channels, wired channels, optical channels and hybrid channels that comprise one or more channels in the communication path. Techniques of the invention may be employed either alone or in conjunction with one or more existing error correction methodologies to thereby enhance such existing methods.

While illustrative embodiments of the invention may be described herein with reference to a FoIP protocol as specified, for example, in the ITU T.38 standard (see, e.g., *ITU-T Recommendation T.38, Group 3 Protocols, Procedures for Real-time Group 3 Facsimile Communication Over IP Networks, SERIES T: TERMINALS FOR TELEMATIC SERVICES, FACSIMILE,* April 2007, the disclosure of which is incorporated by reference herein in its entirety for all purposes) or real-time FoIP protocol, it is to be appreciated that the invention is not limited to use with these or any particular protocol(s) or applications. Rather, principles of the invention may be extended to essentially any data communication protocol, both standard and non-standard, for transmission over a packet-based communication network. Moreover, it will become apparent to those skilled in the art given the teachings herein that numerous modifications can be made to the embodiments shown that are within the scope of the present invention. That is, no limitations with respect to the specific embodiments described herein are intended or should be inferred.

By way of example only, a T.38 protocol for facilitating facsimile data transmission over an IP network (e.g., FoIP) defines two kinds of error correction for User Datagram Protocol Transport Layer (UDPTL) streams. One T.38 error correction methodology utilizes a complex parity forward error correction (FEC) scheme, based on exclusive-ORed data inserted in each UDPTL packet. The other T.38 error correction scheme inserts redundant copies of older Internet facsimile protocol (IFP) packets into each UDPTL packet. In either approach, however, there is a uniform distribution of redundant data packets transmitted, which significantly increases the required bandwidth of the data transmission.

FIG. 1 is a conceptual illustration which shows at least a portion of an exemplary sequence 100 of packets in a standard uniform redundancy error correction methodology. Sequence 100 includes a plurality of uniform redundancy frames 102, 104, 106 and 108 labeled as frame numbers N, N+1, N+2 and N+3, respectively, where N is a positive integer. The term "uniform redundancy" as used herein is intended to refer to the fact that the number of redundant data packets transmitted from one packet frame to the next in a packet sequence is the same (i.e., uniform; does not vary). Specifically, each frame (e.g., N, N+1, N+2, N+3, . . . ) includes one primary packet and two redundant packets. The redundant packets, which are used for error correction, represent the two most recently transmitted packets preceding the primary packet in the sequence. As will be shown, the uniform redundancy error correction approach involves substantial overlapping of information in the redundant packet transmission, which can be wasteful.

More particularly, frame 102 includes a primary packet 110 (sequence number n) and two redundant packets 112 and 114 (sequence numbers n−1 and n−2, respectively), frame 104 includes a primary packet 116 (sequence number n+1) and two redundant packets 118 and 120 (sequence numbers n and n−1, respectively), frame 106 includes a primary packet 122 (sequence number n+2) and two redundant packets 124 and 126 (sequence numbers n+1 and n, respectively), and frame 108 includes a primary packet 128 (sequence number n+3) and two redundant packets 130 and 132 (sequence numbers n+2 and n+1, respectively). As apparent from the figure, the same redundant packet is transmitted in every two adjacent frames. For example, if packet n−1 is lost, it can be recovered from either frame 102 (packet 112) or frame 104 (packet 120). In this manner, there is a substantial overlapping of redundant packets being transmitted.

This error correction scheme increases the bandwidth requirement of the transmission by 200 percent compared to a transmission sequence that does not employ any error correction. Moreover, at most only two consecutive packet frame losses can be recovered using the illustrative error correction approach shown in FIG. 1. Hence, in a bursting packet loss condition where more than two consecutive packet frames are not received, the standard error correction/recovery methodology shown in FIG. 1 will always result in data loss and is therefore inadequate. If three redundant packets were uniformly transmitted with every frame, then three consecutive packet losses could be recovered. However, the tradeoff would be an increase in the required bandwidth by 300 percent compared to no error correction.

With reference now to FIG. 2, a conceptual illustration depicts at least a portion of an exemplary sequence 200 of packets in a non-uniform redundancy error correction methodology, according to an embodiment of the present invention. Sequence 200 includes a plurality of non-uniform redundancy frames 202, 204, 206 and 208 assigned frame numbers N, N+1, N+2 and N+3, respectively, where N is an integer. The frame number is preferably indicative of a temporal relationship between the respective packet frames. For instance, frame number N immediately precedes frame number N+1, and frame number N+2 is indicative of the next frame transmitted subsequently to frame N+1 in the sequence 200 of packets.

The term "non-uniform redundancy" as used herein is intended to refer broadly to the fact that the number of redundant data packets transmitted in a given transmission is not the same for every packet frame, as in the case of a uniform redundancy approach, but rather can vary from one packet frame to the next in the sequence of packets. Thus, all adjacent packet frames do not have the same number of redundant packets in a non-uniform redundancy approach.

Specifically, each frame (e.g., N, N+1, N+2, N+3, . . . ) in the illustrative sequence 200 includes one primary data packet and one or more redundant data packets which are used for error correction, depending on the particular redundancy pattern employed (as will be described in further detail below). As apparent from the figure, unlike in the uniform redundancy approach shown in FIG. 1, the number of transmitted redundant packets is not constant; rather, the number of transmitted redundant packets in this illustrative embodiment alternates between one and three from one packet frame to the next, thus the reference to a non-uniform redundancy error correction methodology. It is to be appreciated that the non-uniform redundancy refers to packet frames in the sequence 200 when taken collectively (i.e., across the sequence). In this manner, the amount of overlapping redundant packet information being transmitted is advantageously reduced.

More particularly, frame 202 includes a primary packet 210 (sequence number n) and one redundant packet 212 (sequence number n−1), frame 204 includes a primary packet 214 (sequence number n+1) and three redundant packets 216, 218 and 220 (sequence numbers n, n−1 and n−2, respectively), frame 206 includes a primary packet 222 (sequence number n+2) and one redundant packet 224 (sequence number n+1), and frame 208 includes a primary packet 226 (sequence number n+3) and three redundant packets 228, 230 and 232 (sequence numbers n+2, n+1 and n, respectively).

For convenience, a sequence $\{n_1, n_2, \ldots, n_q\}$ will be used to represent a repeating pattern of redundant frames, where $n_q$ is an integer indicating the number of redundant packets in frame number q in the repeating pattern. For example, $\{1, 2\}$ indicates a repeating pattern of one and two redundant packets in a sequence of transmitted frames (e.g., 1, 2, 1, 2, 1, 2, . . . ). The uniform redundancy error correction methodology shown in FIG. 1 may be represented, using the above nomenclature, as $\{2, 2\}$, indicating a repeated pattern of two redundant packets in each of the transmitted frames (i.e., 2, 2, 2, 2, . . . ), while the non-uniform redundancy error correction method illustrated in FIG. 2 may be represented as $\{1, 3\}$, indicating the repeated pattern of alternately transmitting one redundant packet (e.g., in frames 202 and 206) and three redundant packets (e.g., frames 204 and 208) in the sequence 200 of packets.

It is to be appreciated that although the illustrative error correction schemes depicted in FIGS. 1 and 2 employ a primary data packet and at least one redundant data packet in each frame, the invention is not limited to such an arrangement. For example, in accordance with embodiments of the invention, each packet frame in at least a subset of the plurality of packet frames in a sequence of data packets comprises at least one primary data packet and a number of redundant data packets that can vary based on a prescribed redundancy pattern employed. Thus, in some cases, a given packet frame may have no (i.e., zero) redundant data packets therein (i.e., only a primary data packet). Consider, for example, a $\{0, 2\}$ redundancy pattern representing a sequence of data packets in which adjacent packet frames alternate between zero and two redundant data packets.

The error correction scheme shown in FIG. 2 having a $\{1, 3\}$ redundancy pattern has the same average redundancy and bandwidth requirement as the uniform redundancy error correction approach $\{2, 2\}$ described above in conjunction with FIG. 1. However, the non-uniform redundancy error correction methodology $\{1, 3\}$ shown in FIG. 2 can not only recover up to two consecutive lost packets from two corresponding consecutive missing packet frames; it also provides a 50 percent probability of successfully recovering three consecutive packet losses from three corresponding consecutive missing packet frames. For example, using the $\{1, 3\}$ non-uniform redundancy error correction methodology of FIG. 2, if packets n, n+1 and n+2 are lost in a burst error condition in which frames 202, 204 and 206, respectively, are not properly received, these lost packets can all be recovered from the redundant information transmitted in frame 208. If, on the other hand, consecutive packets n+1, n+2 and n+3 are lost in a burst error condition in which frames 204, 206 and 208, respectively, are not properly received, only packets n+2 and n+3 can be recovered (since packet n+1 will not be retransmitted in any frame received subsequently to frame 208).

This beneficial technique can be extended to provide the possibility of recovering an even greater number of consecutive packet losses essentially without any increase in bandwidth requirement, according to embodiments of the invention. By way of example only and without loss of generality, FIG. 3 illustrates at least a portion of an exemplary sequence 300 of packets in a non-uniform redundancy error correction methodology, according to another embodiment of the present invention. Sequence 300 includes a plurality of non-uniform redundancy frames 302, 304, 306, 308, 310 and 312 labeled as frame numbers N, N+1, N+2, N+3, N+4 and N+5, respectively, where N is a positive integer. Each frame includes one primary packet and one or more redundant packets which are used for error correction, depending on the particular non-uniform redundancy pattern employed. It is to be understood that the invention is not limited to use with any specific non-uniform redundancy pattern. Like the exemplary non-uniform redundancy error correction scheme illustrated in FIG. 2, the number of redundant packets transmitted is not constant between adjacent frames; rather, the number of transmitted redundant packets follows a repeating pattern; in the case of exemplary sequence 300, a {1, 1, 4} pattern.

Specifically, frame 302 includes a primary packet 314 (sequence number n) and one redundant packet 316 (sequence number n−1), frame 304 includes a primary packet 318 (sequence number n+1) and one redundant packet 320 (sequence number n), frame 306 includes a primary packet 322 (sequence number n+2) and four redundant packets 324 through 326 (sequence numbers n−2 through n+1, respectively; note: packets n−1 and n of frame 306 are between packets 324 and 326, but are not explicitly shown), frame 308 includes a primary packet 328 (sequence number n+3) and one redundant packet 330 (sequence number n+2), frame 310 includes a primary packet 332 (sequence number n+4) and one redundant packet 334 (sequence number n+3), and frame 312 includes a primary packet 336 (sequence number n+5) and four redundant packets 338 through 340 (sequence numbers n+1 through n+4, respectively).

This error correction scheme again has the same average redundancy and bandwidth requirement as the uniform redundancy error correction approach {2, 2} described above in conjunction with FIG. 1. However, the non-uniform redundancy error correction methodology {1, 1, 4} shown in FIG. 3 can not only recover up to two consecutive packet losses from two corresponding consecutive missing packet frames; it also provides a 66 percent probability of successfully recovering three consecutive packet losses, and a 33 percent probability of successfully recovering four consecutive packet losses. For example, using the {1, 1, 4} non-uniform redundancy error correction methodology of FIG. 3, if packets n+1, n+2, n+3 and n+4 are lost in a burst error condition in which frames 304, 306, 308 and 310, respectively, are not received, they can all be recovered from the redundant information transmitted in frame 312. If, on the other hand, consecutive packets n, n+1, n+2 and n+3 are lost in a burst error condition in which frames 302, 304, 306 and 308, respectively, are not received, only packet n+3 can be recovered from frame 310 and packets n+1, n+2 (and, again, n+3) can be recovered from frame 312; packet n would be unrecoverable.

In general, the uniform redundancy error correction methodology having redundancy N can only recover up to N consecutive bursting packet losses. By contrast, the non-uniform redundancy error correction techniques according to aspects of the present invention are able to provide recovery of more than N consecutive bursting packet losses, at least a certain percentage of the time, with no increase in the required bandwidth, as previously explained. Furthermore, as will become apparent to those skilled in the art given the teachings herein, non-uniform redundant patterns can be easily tailored to achieve a desired consecutive bursting packet loss recovery for targeted network conditions. Specifically, one may generate a non-uniform redundancy pattern as a function of one or more characteristics of the communication network (e.g., based on the type of packets—data, voice, facsimile, etc.—being transmitted, among other characteristics) to thereby match the most likely consecutive packet loss of a particular network.

By way of illustration only and without loss of generality, Table 1 below lists several exemplary non-uniform redundancy error correction patterns and corresponding probabilities for packet loss recovery, according to embodiments of the invention.

TABLE 1

| Average Redundancy | Redundant Pattern | Number of Consecutive Packet Losses Recovered | | | |
|---|---|---|---|---|---|
| | | 1 | 2 | 3 | 4 |
| 1 | {1, 1, 1}* | 100% | 0 | 0 | 0 |
| | {0, 2} | 100% | 50% | 0 | 0 |
| | {0, 0, 3} | 100% | 66% | 33% | 0 |
| | {0, 0, 0, 4} | 100% | 75% | 50% | 25% |
| 2 | {2, 2, 2}* | 100% | 100% | 0 | 0 |
| | {1, 3} | 100% | 100% | 50% | 0 |
| | {1, 1, 4} | 100% | 100% | 66% | 33% |

*Uniform redundancy error correction (as a comparison)

As apparent from Table 1 above, for an average redundancy of one, the uniform redundancy error correction pattern {1, 1, 1} is able to recover only a single consecutive packet loss. For the same bandwidth requirement as for the {1, 1, 1} pattern, a non-uniform redundancy error correction pattern of {0, 2}, according to aspects of the invention, achieves 100 percent recovery of a single consecutive packet loss, but also achieves a 50 percent probability of success in recovering two consecutive packet losses in a burst error condition in which two consecutive packet frames are not received. A non-uniform redundancy error correction pattern of {0, 0, 3} achieves 100 percent recovery of a single consecutive packet loss, but also achieves a 66 percent probability of success in recovering two consecutive packet losses in a burst error condition in which two consecutive packet frames are not received and a 33 percent probability of success in recovering three consecutive packet losses in a burst error condition in which three consecutive packet frames are not received. Likewise, a non-uniform redundancy error correction pattern of {0, 0, 0, 4} achieves 100 percent recovery of a single consecutive packet loss, but also achieves a 75 percent probability of success in recovering two consecutive packet losses, a 50 percent probability of success in recovering three consecutive packet losses and a 25 percent probability of success in recovering four consecutive packet losses in a burst error condition in which four consecutive packet frames are not received.

For an average redundancy of two, the uniform redundancy error correction pattern {2, 2, 2} only achieves recovery of up to two consecutive packet losses. By comparison, for the same bandwidth requirement as for the uniform redundancy error correction approach, a non-uniform redundancy error correction pattern of {1, 3}, according to aspects of the invention, achieves 100 percent recovery of up to two consecutive packet losses, but also achieves a 50 percent probability of success in recovering three consecutive packet losses. Likewise, a non-uniform redundancy error correction pattern of {1, 1, 4} achieves 100 percent recovery of up to two consecutive packet losses, but also achieves a 66 percent probability of success in recovering three consecutive packet losses and a 33 percent probability of success in recovering four consecutive packet losses.

The non-uniform redundancy error correction techniques of the present invention can be advantageously combined with one or more other error correction methodologies to provide an enhanced level of error correction in the packet-based communication network. For example, FIG. 4 is a conceptual illustration which depicts at least a portion of an exemplary sequence 400 of packets in a non-uniform redundancy error correction methodology, according to yet another embodiment of the present invention. In this exemplary embodiment, the non-uniform redundancy error correction methodology is beneficially combined with a selective packet retransmission scheme to achieve enhanced packet loss recovery, in accordance with aspects of the invention.

Sequence 400 includes a plurality of non-uniform redundancy frames 402, 404, 406, 408, 410 and 412 labeled as frame numbers N, N+1, N+2, N+3, N+4 and N+5, respectively, where N is an integer. Each frame includes one primary packet and one or more redundant packets which are used for error correction, depending on the particular redundancy pattern employed. It is to be appreciated that the invention is not limited to any specific redundancy pattern. Like the exemplary non-uniform redundancy error correction schemes illustrated in FIGS. 2 and 3, the number of redundant packets transmitted is not constant between all adjacent frames; rather, the number of transmitted redundant packets follows a repeating pattern; in this case, a {1, 1, 4} pattern.

Specifically, frame 402 includes a primary packet 414 (sequence number n) and one redundant packet 416 (sequence number n−1), frame 404 includes a primary packet 418 (sequence number n+1) and one redundant packet 420 (sequence number n), frame 406 includes a primary packet 422 (sequence number n+2) and four redundant packets 424 through 426 (sequence numbers n−2 through n+1, respectively), frame 408 includes a primary packet 428 (sequence number n+3) and one redundant packet 430 (sequence number n+2), frame 410 includes a primary packet 432 (sequence number n+4) and one redundant packet 434 (sequence number n+3), and frame 412 includes a primary packet 436 (sequence number n+5) and four redundant packets 438 through 440 (sequence numbers n+1 through n+4, respectively).

With this scheme, a first packet 442 (packet n+2) and a second packet 444 (packet n+5) are resent without redundancy. These packets, 442 and 444, are preferably used to protect against the loss of the regular N+2 and N+5 frames, respectively, since these frames contain the highest level of redundant packets. For different redundancy patterns, the selection of which packet or packets to resend may be modified accordingly. It is to be understood that the invention is not limited to any specific number or order of packet retransmission in the sequence of packets. By resending packets 442 and 444 without redundancy, the bandwidth requirement only increases by about 11 percent; probabilities for recovering three and four consecutive lost packets increase to 75% and 50% respectively.

Figure 5:
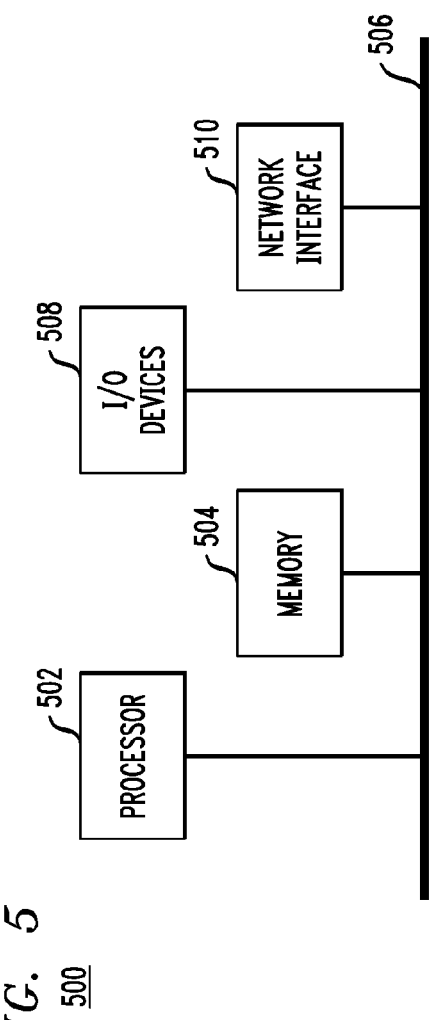
FIG. 5 is a block diagram depicting an exemplary data processing system, according to an aspect of the present invention.

Methodologies of embodiments of the present invention may be particularly well-suited for implementation in an electronic device or alternative system, such as, for example, a network-capable fax device, fax communications system, etc. By way of illustration only, FIG. 5 is a block diagram depicting an exemplary data processing system 500, formed in accordance with an aspect of the invention. System 500 may represent, for example, a fax device (e.g., fax modem, fax machine, etc.) adapted for communicating with a PC and/or another fax device using, for example, a T.38 communication protocol. System 500 may include a processor 502, memory 504 coupled to the processor, as well as input/output (I/O) circuitry 508 operative to interface with the processor. Processor 502 may be included, for example, in a transmitter and/or a receiver (e.g., a modem) of system 500 and adapted to perform data communications incorporating error correction techniques of the present invention, as will become apparent to those skilled in the art given the teachings herein.

The processor 502, memory 504, and I/O circuitry 508 can be interconnected, for example, via a bus 506, or alternative connection means, as part of data processing system 500. Suitable interconnections, for example via the bus, can also be provided to a network interface 510, such as a network interface card (NIC), which can be provided to interface with a computer or IP network, and to a media interface, such as a diskette or CD-ROM drive, which can be provided to interface with media. The processor 502 may be configured to perform at least a portion of the methodologies of the present invention described herein above.

It is to be appreciated that the term "processor" as used herein is intended to include any processing device, such as, for example, one that includes a central processing unit (CPU) and/or other processing circuitry (e.g., network processor, DSP, microprocessor, etc.). Additionally, it is to be understood that the term "processor" may refer to more than one processing device, and that various elements associated with a processing device may be shared by other processing devices. The term "memory" as used herein is intended to include memory and other computer-readable media associated with a processor or CPU, such as, for example, random access memory (RAM), read only memory (ROM), fixed storage media (e.g., a hard drive), removable storage media (e.g., a diskette), flash memory, etc. Furthermore, the term "I/O circuitry" as used herein is intended to include, for example, one or more input devices (e.g., keyboard, mouse, etc.) for entering data to the processor, one or more output devices (e.g., printer, monitor, etc.) for presenting the results associated with the processor, and/or interface circuitry for operatively coupling the input or output device(s) to the processor.

Accordingly, an application program, or software components thereof, including instructions or code for performing the methodologies of the invention, as described herein, may be stored in one or more of the associated storage media (e.g., ROM, fixed or removable storage) and, when ready to be utilized, loaded in whole or in part (e.g., into RAM) and executed by the processor 502. In any case, it is to be appreciated that at least a portion of the methodologies shown in FIGS. 2 through 4 may be implemented in various forms of hardware, software, or combinations thereof, e.g., one or more DSPs with associated memory, application-specific integrated circuit(s), functional circuitry, one or more operatively programmed general purpose digital computers with associated memory, etc. Given the teachings of the invention provided herein, one of ordinary skill in the art will be able to contemplate other implementations of the techniques of the invention.

By way of example only and without loss of generality, FIG. 6 is a block diagram illustrating an electronic system 600 for performing error correction in a data transmission over a packet-based communication network, according to an embodiment of the invention. System 600 includes at least one transmitter 602 and at least one receiver 604 adapted to communicate with one another via a packet-based communication network 606. Transmitter 602 preferably includes at least one processor 608 operative to generate a sequence of data packets for transmission over the communication network, the sequence of data packets being arranged into a plurality of packet frames. Each packet frame of at least a subset of the packet frames includes at least a primary data packet and a number of redundant data packets which is a function of a prescribed redundancy pattern, as previously described. The packet frames have a non-uniform distribution of redundant data packets therein. Transmitter 602 is operative to transmit the sequence of data packets over the communication network 606.

Receiver 604 is operative to receive the sequence of data packets from the communication network 606. Receiver 604 includes at least one processor 610 which is operative to identify one or more missing data packets in a received sequence of data packets and to recover the missing data packet(s) using at least one corresponding redundant data packet in at least one subsequently received packet frame when the missing data packet(s) is/are identified. In accordance with an embodiment of the invention, receiver 604 and transmitter 602 are integrated into a single transceiver which incorporates the transmitting and receiving functions therein.

At least a portion of the techniques of the present invention may be implemented in one or more integrated circuits. In forming integrated circuits, die are typically fabricated in a repeated pattern on a surface of a semiconductor wafer. Each of the die includes a memory described herein, and may include other structures or circuits. Individual die are cut or diced from the wafer, then packaged as integrated circuits. One skilled in the art would know how to dice wafers and package die to produce integrated circuits. Integrated circuits so manufactured are considered part of this invention.

An IC in accordance with embodiments of the present invention can be employed in any application and/or electronic system which is adapted for providing fax communications (e.g., fax modem/machine). Suitable systems for implementing embodiments of the invention may include, but are not limited to, personal computers, portable communications devices (e.g., cell phones), fax devices, etc. Systems incorporating such integrated circuits are considered part of this invention. Given the teachings of the invention provided herein, one of ordinary skill in the art will be able to contemplate other implementations and applications of the techniques of the invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A method for correcting at least one error in a data transmission over a packet-based communication network, the method comprising the steps of:
    generating a sequence of data packets for transmission over the packet-based communication network, the sequence of data packets being arranged into a plurality of packet frames, each of at least a subset of the packet frames including at least one primary data packet and a number of redundant data packets which is a function of a prescribed redundancy pattern, the subset of packet frames having a non-uniform distribution of redundant data packets therein across the plurality of packet frames;
    transmitting the sequence of data packets over the communication network; and
    recovering at least one missing data packet in the sequence of data packets using at least one corresponding redundant data packet in at least one subsequently received packet frame when the at least one missing data packet is identified in a receiver of the sequence of data packets.

2. The method of claim 1, wherein each packet frame in the subset of packet frames includes a primary data packet and at least one redundant data packet therein.

3. The method of claim 1, wherein at least one pair of respective adjacent packet frames in the sequence of data packets have a different number of redundant data packets therein.

4. The method of claim 1, wherein at least one packet frame in the subset of packet frames comprises zero redundant data packets therein.

5. The method of claim 1, further comprising assigning a frame identifier to each packet frame in the subset of packet frames, the frame identifier being indicative of a temporal relationship between the respective subset of packet frames.

6. The method of claim 5, wherein the step of generating the sequence of data packets for transmission over the packet-based communication network comprises inserting a primary data packet n and at least one redundant data packet n−1 into a given packet frame, where n is an identifier corresponding to the primary data packet in the given packet frame and n−1 is an identifier corresponding to a primary data packet in a packet frame temporally preceding the given packet frame.

7. The method of claim 1, wherein the step of generating the sequence of data packets for transmission over the packet-based communication network comprises inserting a primary data packet and at least one redundant data packet into a given packet frame, where the primary data packet corresponds to the given packet frame and the at least one redundant data packet corresponds to a primary data packet in an adjacent packet frame temporally preceding the given packet frame.

8. The method of claim 1, wherein the step of generating the sequence of data packets for transmission over the packet-based communication network comprises generating a repeating pattern of packet frames in which at least a portion of the repeating pattern includes a first packet frame having a first number of redundant data packets and a second packet frame having a second number of redundant data packets, the first and second packet frames being adjacent to one another in the sequence of data packets, the first and second number of redundant data packets being different.

9. The method of claim 8, wherein the first number of redundant data packets is one and the second number of redundant data packets is more than one.

10. The method of claim 1, wherein the step of generating the sequence of data packets for transmission over the packet-based communication network comprises generating a repeating pattern of packet frames in which at least a portion of the repeating pattern includes a first packet frame having no redundant data packets and a second packet frame having a plurality of redundant data packets, the first and second packet frames being adjacent to one another in the sequence of data packets.

11. The method of claim 1, wherein the step of recovering the at least one missing data packet comprises retrieving a plurality of corresponding redundant data packets in at least one subsequently received packet frame in the sequence of data packets.

12. The method of claim 1, wherein the step of recovering the at least one missing data packet comprises retrieving a plurality of corresponding redundant data packets in a plurality of subsequently received packet frames in the sequence of data packets.

13. The method of claim 1, further comprising selectively retransmitting, without redundancy, at least one data packet in the sequence of data packets over the communication network.

14. The method of claim 13, wherein selective retransmission of at least one data packet comprises inserting a new packet frame including a given data packet immediately following a packet frame including the given data packet and a plurality of redundant data packets.

15. The method of claim 1, further comprising generating the redundancy pattern as a function of at least one characteristic of the packet-based communication network.

16. An apparatus for performing error correction in a data transmission over a packet-based communication network, the apparatus comprising:
at least one processor operative to generate a sequence of data packets for transmission over the packet-based communication network, the sequence of data packets being arranged into a plurality of packet frames, each of at least a subset of the packet frames including at least one primary data packet and a number of redundant data packets which is a function of a prescribed redundancy pattern, the subset of packet frames having a non-uniform distribution of redundant data packets therein across the plurality of packet frames; and forwarding the sequence of data packets to a transmitter for transmission of the sequence of data packets over the communication network, wherein at least one missing data packet in the sequence of data packets is recoverable using at least one corresponding redundant data packet in at least one subsequently received packet frame when the at least one missing data packet is identified in a receiver of the sequence of data packets.

17. The apparatus of claim 16, wherein each packet frame in the subset of packet frames includes a primary data packet and at least one redundant data packet therein.

18. The apparatus of claim 16, wherein at least one pair of respective adjacent packet frames in the sequence of data packets have a different number of redundant data packets therein.

19. The apparatus of claim 16, wherein at least one packet frame in the subset of packet frames comprises no redundant data packets therein.

20. The apparatus of claim 16, wherein the at least one processor is operative to assign a frame identifier to each of the subset of packet frames in the sequence of data packets, the frame identifier being indicative of a temporal relationship between the respective packet frames in the subset of packet frames.

21. The apparatus of claim 20, wherein the at least one processor is operative to insert a primary data packet n and at least one redundant data packet n−1 into a given packet frame, where n is an identifier corresponding to the primary data packet in the given packet frame and n−1 is an identifier corresponding to a primary data packet in a packet frame temporally preceding the given packet frame.

22. The apparatus of claim 16, wherein the at least one processor is operative to generate a repeating pattern of packet frames in which at least a portion of the repeating pattern includes a first packet frame having a first number of redundant data packets and a second packet frame having a second number of redundant data packets, the first and second packet frames being adjacent to one another in the sequence of data packets, the first and second number of redundant data packets being different.

23. The apparatus of claim 16, wherein the at least one processor is operative to generate a repeating pattern of packet frames in which at least a portion of the repeating pattern includes a first packet frame having no redundant data packets and a second packet frame having a plurality of redundant data packets, the first and second packet frames being adjacent to one another in the sequence of data packets.

24. The apparatus of claim 16, wherein the transmitter is operative to selectively retransmit, without redundancy, at least one data packet in the sequence of data packets over the communication network.

25. The apparatus of claim 24, wherein the transmitter is operative to retransmit the at least one data packet by inserting a new packet frame including a given data packet immediately following a packet frame including the given data packet and a plurality of redundant data packets.

26. An electronic system for performing error correction in a data transmission over a packet-based communication network, the system comprising:
a transmitter operatively coupled to the packet-based communication network, the transmitter including at least one processor operative to generate a sequence of data packets for transmission over the packet-based communication network, the sequence of data packets being arranged into a plurality of packet frames, each of at least a subset of the packet frames including at least a primary data packet and a number of redundant data packets which is a function of a prescribed redundancy pattern, the subset of packet frames having a non-uniform distribution of redundant data packets therein across the plurality of packet frames, the transmitter being operative to transmit the sequence of data packets over the communication network; and
a receiver operatively coupled to the packet-based communication network, the receiver being operative to receive the sequence of data packets from the communication network, the receiver including at least one processor operative to identify at least one missing data packet in the received sequence of data packets, and to recover the at least one missing data packet using at least one corresponding redundant data packet in at least one subsequently received packet frame when the at least one missing data packet is identified.

27. A transceiver configured to perform error correction in a packet-based communication network, the transceiver comprising:
at least one transmitter configured to connect to the communication network, the at least one transmitter being operative to transmit a sequence of data packets for transmission over the packet-based communication network, the transmitted sequence of data packets being arranged into a plurality of packet frames, each of at least a subset of the packet frames including at least a primary data packet and a number of redundant data packets which is a function of a prescribed redundancy pattern, the subset of packet frames having a non-uniform distribution of redundant data packets therein across the plurality of packet frames, the transmitter being operative to transmit the sequence of data packets over the communication network; and
at least one receiver configured to connect to the communication network, the at least one receiver being operative: to receive a sequence of data packets from the packet-based communication network; to identify at least one missing data packet in the received sequence of data packets; and to recover the at least one missing data packet using at least one corresponding redundant data packet in at least one subsequently received packet frame when the at least one missing data packet is identified.

* * * * *